US010418332B2

(12) United States Patent
Lee et al.

(10) Patent No.: US 10,418,332 B2
(45) Date of Patent: Sep. 17, 2019

(54) SEMICONDUCTOR DEVICE AND METHOD OF FORMING PARTITION FENCE AND SHIELDING LAYER AROUND SEMICONDUCTOR COMPONENTS

(71) Applicant: STATS ChipPAC Pte. Ltd., Singapore (SG)

(72) Inventors: Goo Lee, Incheon (KR); KyungMoon Kim, Gyeonggi-do (KR); SooSan Park, Seoul (KR); KeoChang Lee, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 144 days.

(21) Appl. No.: 15/456,972

(22) Filed: Mar. 13, 2017

(65) Prior Publication Data

US 2018/0261551 A1    Sep. 13, 2018

(51) Int. Cl.
H01L 23/552    (2006.01)
H01L 21/56    (2006.01)
(Continued)

(52) U.S. Cl.
CPC ............ *H01L 23/552* (2013.01); *H01L 21/56* (2013.01); *H01L 23/16* (2013.01); *H01L 23/5383* (2013.01); *H01L 23/5384* (2013.01); *H01L 23/5386* (2013.01); *H01L 24/17* (2013.01); *H01L 24/32* (2013.01); *H01L 24/49* (2013.01); *H01L 24/73* (2013.01); *H01L 25/0655* (2013.01); *H01L 25/16* (2013.01); *H01L 25/50* (2013.01); *H01L 23/3128* (2013.01); *H01L 2224/0401* (2013.01); *H01L 2224/05111* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01);
(Continued)

(58) Field of Classification Search
CPC combination set(s) only.
See application file for complete search history.

(56) References Cited

U.S. PATENT DOCUMENTS 7,851,893 B2    12/2010    Kim et al.
9,070,793 B2    6/2015    Liao et al.
(Continued)

*Primary Examiner* — Mamadou L Diallo
(74) *Attorney, Agent, or Firm* — Robert D. Atkins; Patent Law Group: Atkins and Associates, P.C.

(57) ABSTRACT

A semiconductor device has a partition fence disposed between a first attach area and a second attach area on a substrate. A first electrical component is disposed over the first attach area. A second electrical component is disposed over the second attach area. The partition fence extends above and along a length of the first electrical component and second electrical component. An encapsulant is deposited over the substrate, first electrical component, second electrical component, and partition fence. A portion of the encapsulant is removed to expose a surface of the partition fence and planarizing the encapsulant. A shielding layer is formed over the encapsulant and in contact with the surface of the partition fence. The combination of the partition fence and shielding layer compartmentalize the first electrical component and second electrical component for physical and electrical isolation to reduce the influence of EMI, RFI, and other inter-device interference.

22 Claims, 9 Drawing Sheets

(51) Int. Cl.
- *H01L 25/00* (2006.01)
- *H01L 23/00* (2006.01)
- *H01L 25/16* (2006.01)
- *H01L 25/065* (2006.01)
- *H01L 23/538* (2006.01)
- *H01L 23/16* (2006.01)
- *H01L 23/31* (2006.01)

(52) U.S. Cl.
CPC ........ *H01L 2224/1146* (2013.01); *H01L 2224/11334* (2013.01); *H01L 2224/131* (2013.01); *H01L 2224/13023* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16235* (2013.01); *H01L 2224/16238* (2013.01); *H01L 2224/2919* (2013.01); *H01L 2224/48091* (2013.01); *H01L 2224/48179* (2013.01); *H01L 2224/73265* (2013.01); *H01L 2224/81815* (2013.01); *H01L 2924/1203* (2013.01); *H01L 2924/1304* (2013.01); *H01L 2924/1421* (2013.01); *H01L 2924/19011* (2013.01); *H01L 2924/19041* (2013.01); *H01L 2924/19042* (2013.01); *H01L 2924/19043* (2013.01); *H01L 2924/3025* (2013.01)

(56) References Cited

U.S. PATENT DOCUMENTS

| | | | |
|---|---|---|---|
| 9,721,903 B2* | 8/2017 | Lee | H01L 23/552 |
| 9,820,373 B2* | 11/2017 | Pennathur | H05K 1/0203 |
| 2012/0025356 A1* | 2/2012 | Liao | H01L 23/3121 |
| | | | 257/659 |
| 2017/0077022 A1* | 3/2017 | Scanlan | H01L 23/49838 |
| 2018/0130755 A1* | 5/2018 | Lee | H01L 21/56 |
| 2018/0277489 A1* | 9/2018 | Han | H01L 23/552 |

* cited by examiner

US 10,418,332 B2

SEMICONDUCTOR DEVICE AND METHOD OF FORMING PARTITION FENCE AND SHIELDING LAYER AROUND SEMICONDUCTOR COMPONENTS

FIELD OF THE INVENTION

The present invention relates in general to semiconductor devices and, more particularly, to a semiconductor device and method of forming a shielding layer in direct contact with a partition fence disposed around semiconductor components in an SIP module.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices, particular in high frequency applications such as radio frequency (RF) wireless communications, often contain one or more integrated passive devices (IPDs) to perform necessary electrical functions. The IPDs are susceptible to electromagnetic interference (EMI), radio frequency interference (RFI), harmonic distortion, or other inter-device interference, such as capacitive, inductive, or conductive coupling, also known as cross-talk, which can interfere with their operation. The high-speed switching of digital circuits also generate interference.

Multiple semiconductor die and discrete IPDs can be integrated into a system-in-package (SIP) module for higher density in a small space and extended electrical functionality. The semiconductor die and discrete IPDs are mounted to a substrate for structural support and electrical interconnect. An encapsulant is deposited over the semiconductor die, discrete IPDs, and substrate. A shielding layer is formed over the encapsulant to isolate sensitive circuits. The SIP module substrate is physically mounted and electrically connected to a board in the next level of integration. An internal barrier may be formed in the encapsulant between the semiconductor die and discrete IPDs for inter-device EMI and RFI isolation. The internal barrier often requires additional processing steps, e.g., drilling or etching and separate electrical interconnect, for a ground path from the shielding layer through the internal barrier.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
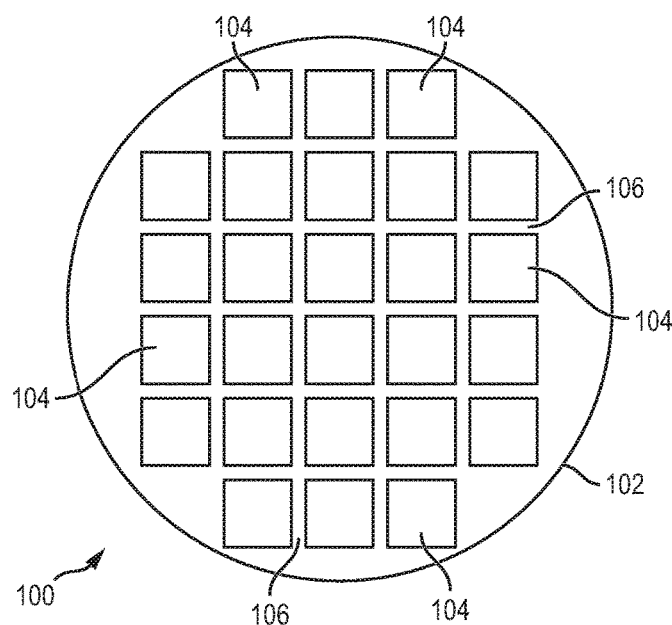
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
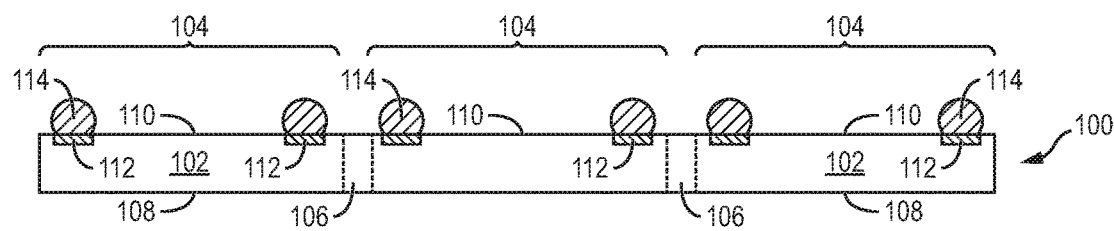

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
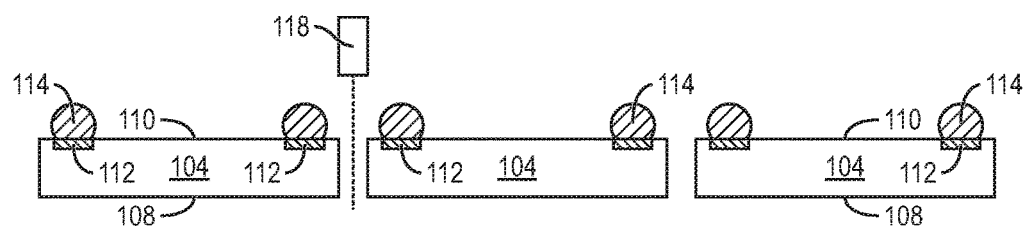

In FIG. 1c, semiconductor wafer 100 is singulated through saw street 106 using a saw blade or laser cutting tool 118 into individual semiconductor die 104. The individual semiconductor die 104 can be inspected and electrically tested for identification of KGD post singulation.

Figure 2A:
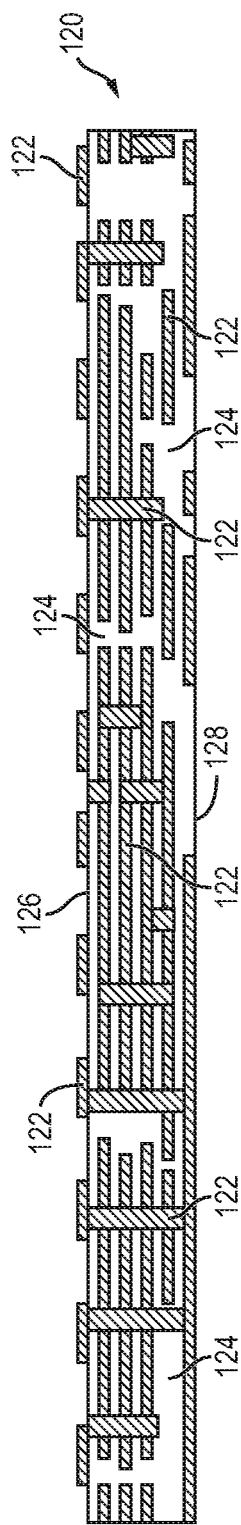
FIGS. 2a-2j illustrate a process of forming a shielding layer in direct contact with a partition fence disposed around semiconductor components in an SIP module.

FIGS. 2a-2j illustrate a process of forming a shielding layer in direct contact with a partition fence disposed around semiconductor components in an SIP module. FIG. 2a shows a cross-sectional view of substrate 120 including conductive layers 122 and insulating layer 124. Conductive layer 122 can be one or more layers of Al, Cu, Sn, Ni, Au, Ag, or other suitable electrically conductive material. Conductive layer 122 provides horizontal electrical interconnect across substrate 120 and vertical electrical interconnect between surface 126 and surface 128 of substrate 120. Portions of conductive layer 122 can be electrically common or electrically isolated depending on the design and function of semiconductor die 104. Insulating layer 124 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layer 124 provides isolation between conductive layers 122.

Figure 2B:
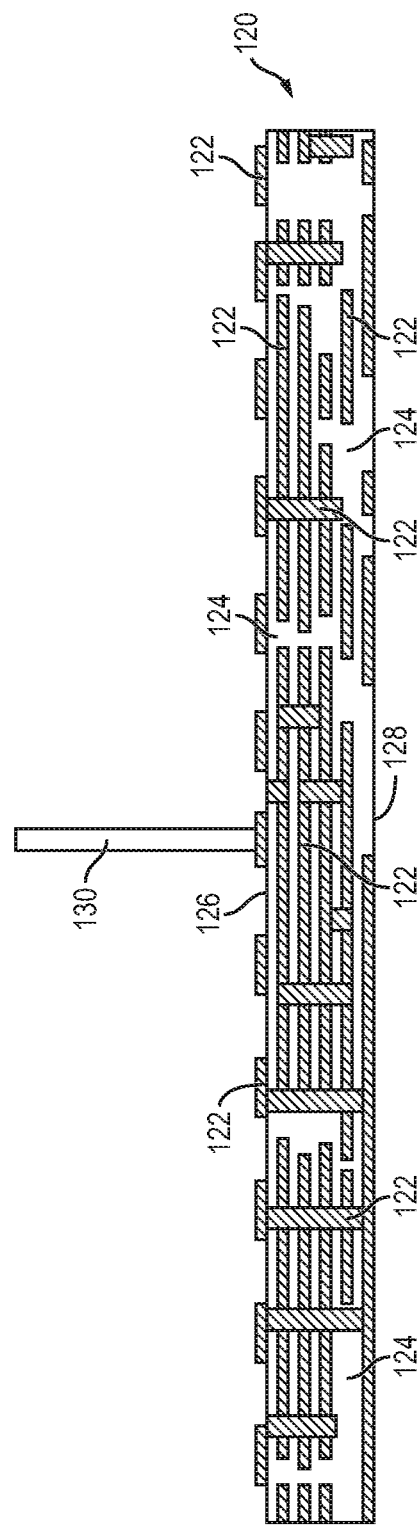

In FIG. 2b, partition fence or lid 130 is bonded to conductive layer 122 on surface 126 of substrate 120, e.g., with conductive paste. Partition fence 130 can be one or more layers of Al, Cu, Sn, Ni, Au, Ag, or other suitable conductive material. Alternatively, partition fence 130 can be carbonyl iron, stainless steel, nickel silver, low-carbon steel, silicon-iron steel, foil, conductive resin, carbon-black, aluminum flake, and other metals and composites capable of reducing the effects of EMI, RFI, and other inter-device interference. Partition fence 130 is electrically connected to conductive layer 122 to provide an external ground and extends vertically from surface 126 of substrate 120.

Figure 2C:
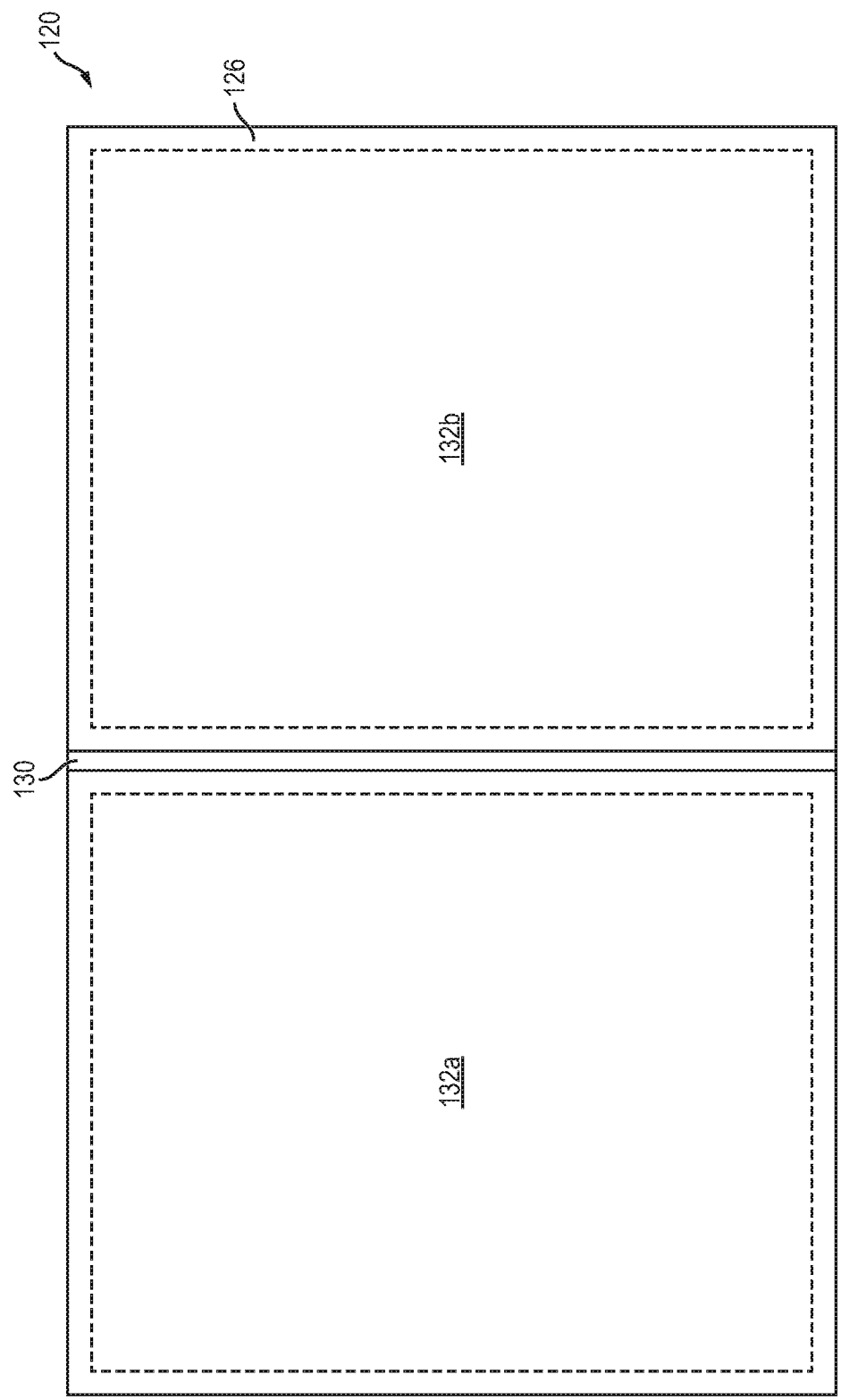
Figure 2D:
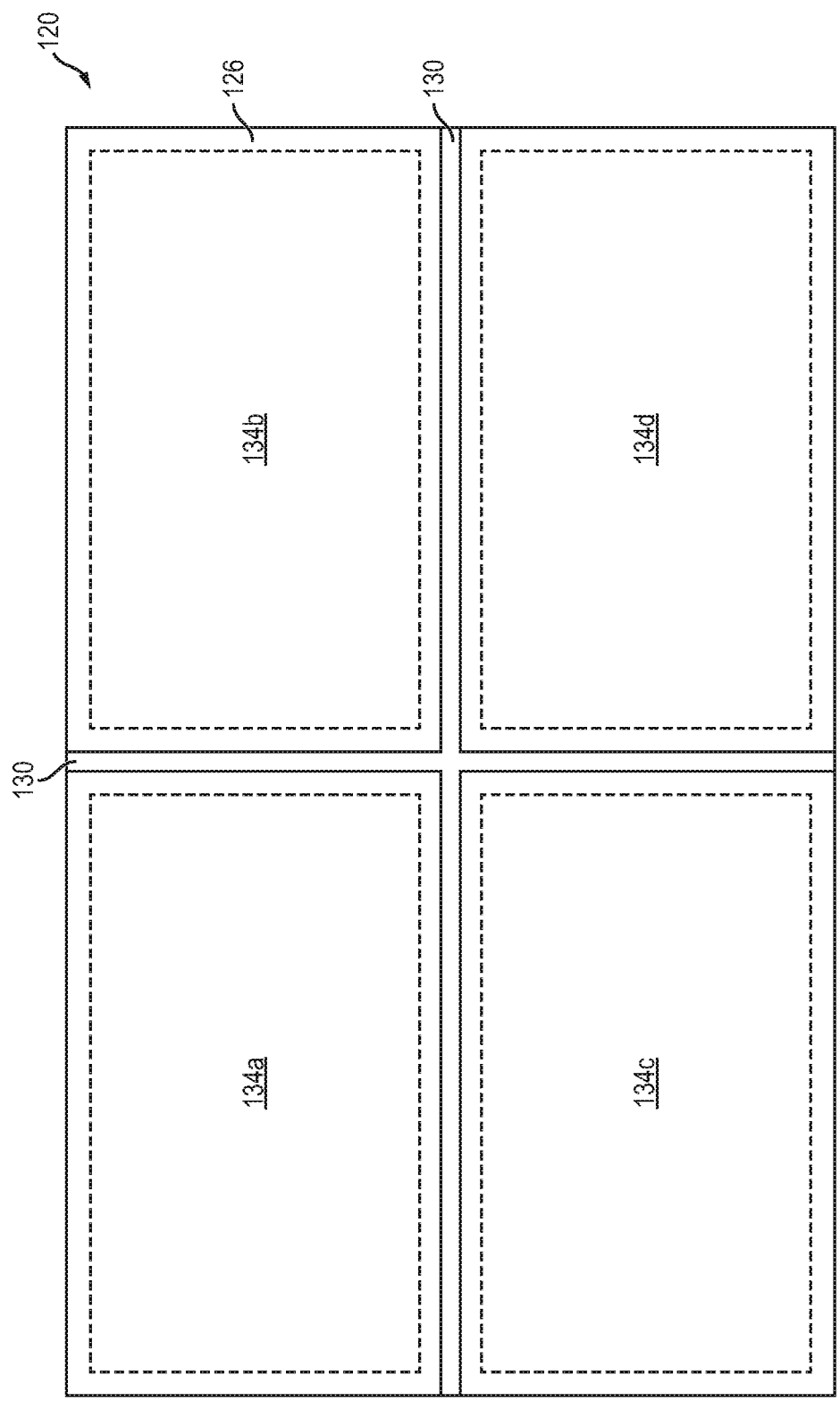

FIG. 2c shows a plan view of partition fence 130 disposed over surface 126 to divide substrate 120 into two sections containing die attach areas 132a and 132b. Partition fence 130 extends across substrate 120 along the length of die attach areas 132a and 132b. In another embodiment shown in FIG. 2d, partition fence 130 divides substrate 120 into four sections containing die attach areas 134a-134d. Partition fence 130 extends across a length and width of substrate 120 between die attach areas 134a-134d. In general, partition fence 130 can be arranged to divide substrate 120 into as many sections as needed for the application. The sections of substrate 120 may be equal in surface area or different in surface area.

Figure 2E:
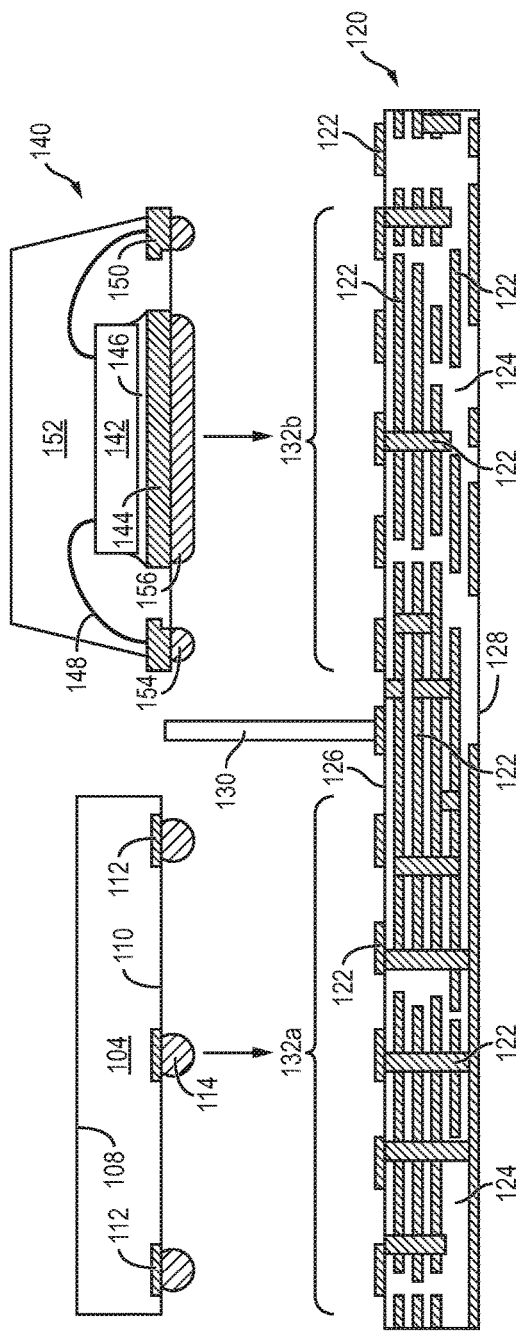

In FIG. 2e, semiconductor die 104 from FIG. 1c is positioned over die attach area 132a using a pick and place operation with active surface 110 and bumps 114 oriented toward surface 126. Semiconductor package 140 is positioned over die attach area 132b. In one embodiment, semiconductor package 140 includes semiconductor die 142 as singulated from a semiconductor substrate, similar to FIGS. 1a-1c. Semiconductor die 142 is mounted to leadframe 144 with adhesive 146. Bond wires 148 connect semiconductor die 142 to terminals 150 of leadframe 144. An encapsulant 152 is deposited over semiconductor die 142, bond wires 148, and leadframe 144. Alternatively, semiconductor package 140 includes a discrete electrical device or IPD, such as a resistor, capacitor, and inductor.

Figure 2F:
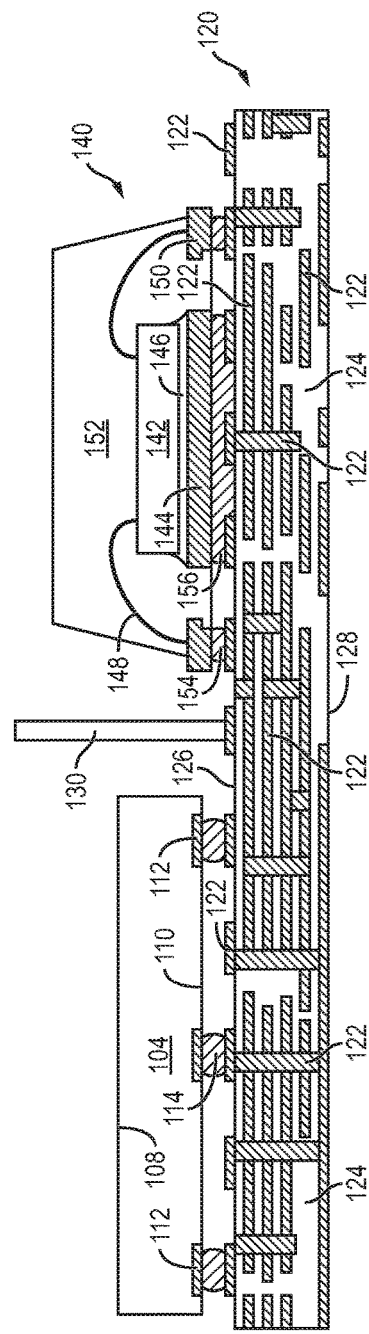

FIG. 2f shows semiconductor die 104 bonded to a first portion of conductive layer 122 within die attach area 132a of substrate 120 by reflowing bumps 114. Semiconductor package 140 is bonded to a second portion of conductive layer 122 within die attach area 132b of substrate 120 with bumps or conductive paste 154 and adhesive 156. Partition fence 130 extends above semiconductor die 104 and semiconductor package 140 and provides physical and electrical separation between the semiconductor die and semiconductor package. Partition fence 130 may be bonded to conductive layer 122 on surface 126 of substrate 120 after bonding semiconductor die 104 to die attach area 132a and semiconductor package 140 to die attach area 132b. Semiconductor die 104 and semiconductor package 140 represent various semiconductor or electrical components that can be disposed over die attach areas 132a-132b of substrate 120. Other semiconductor or electrical components include a semiconductor module and discrete electrical device, such as a resistor, capacitor, and inductor.

Figure 2G:
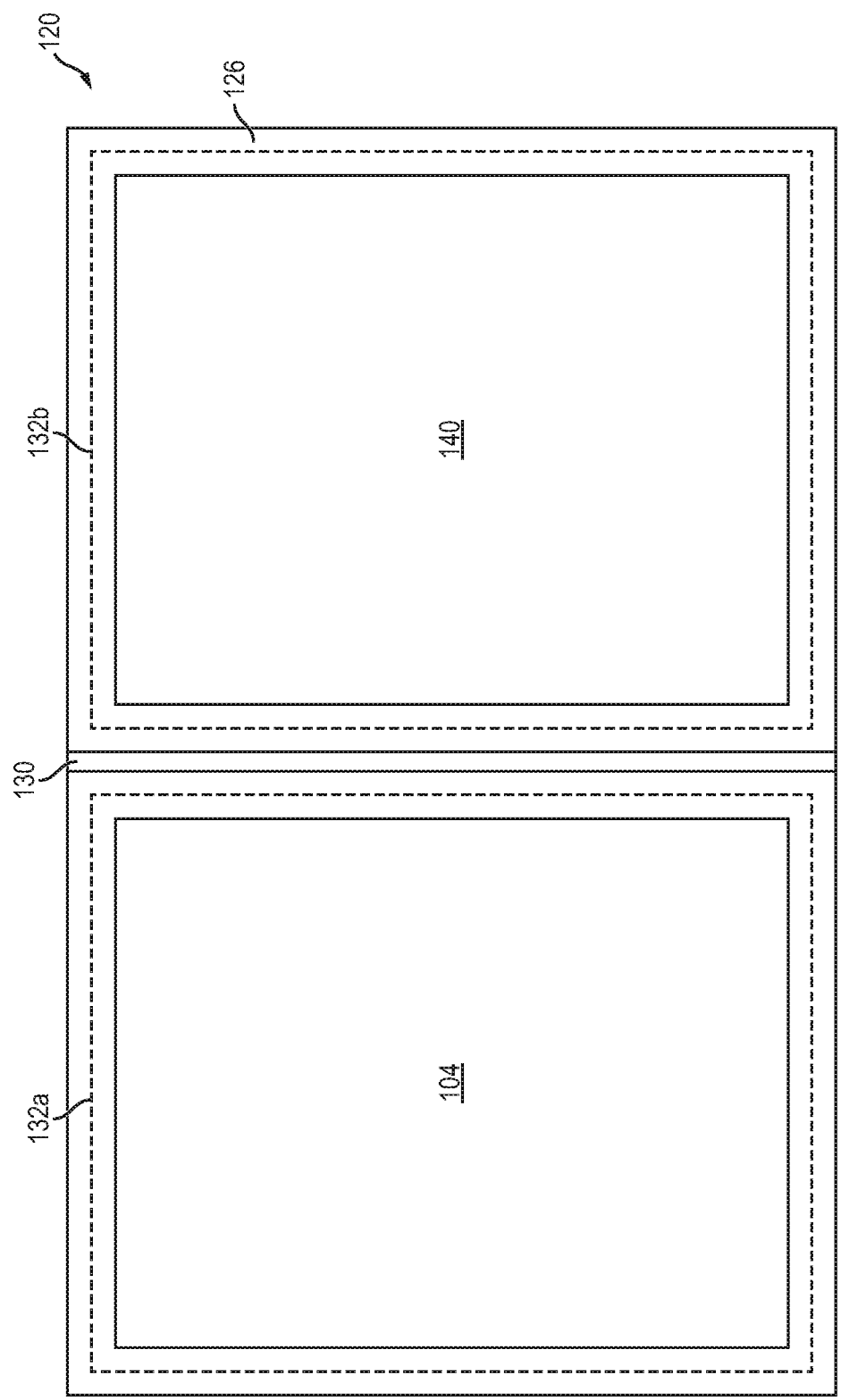

FIG. 2g shows a plan view of semiconductor die 104 and semiconductor package 140 bonded to substrate 120 with partition fence 130 providing physical and electrical isolation between the semiconductor components. Partition fence 130 extends across substrate 120 along the length of semiconductor die 104 and semiconductor package 140.

Figure 2H:
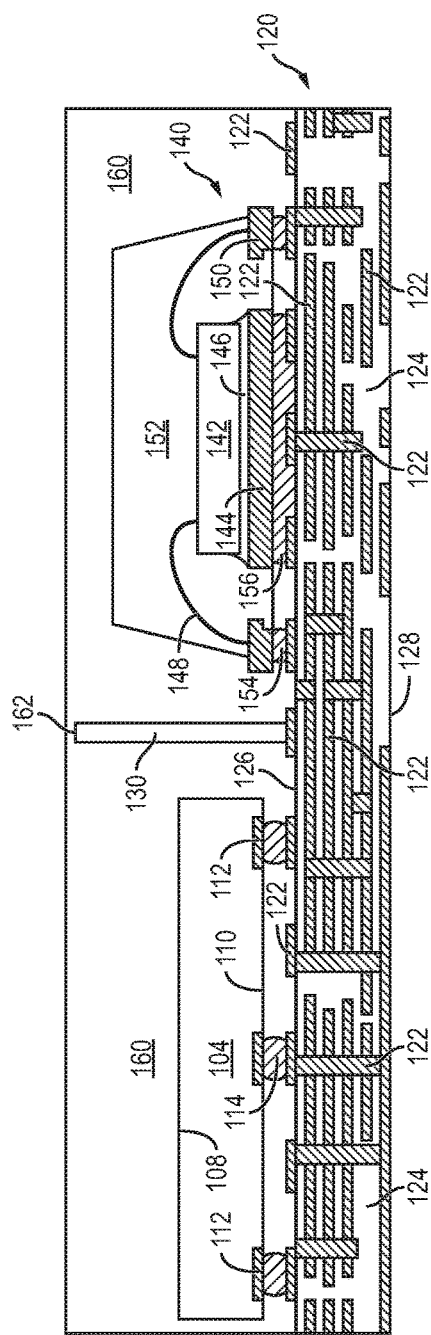

In FIG. 2h, an encapsulant or molding compound 160 is deposited over semiconductor die 104, semiconductor package 140, partition fence 130, and substrate 120 using a paste printing, compressive molding, transfer molding, liquid encapsulant molding, vacuum lamination, spin coating, or other suitable applicator. Encapsulant 160 can be polymer composite material, such as epoxy resin with filler, epoxy acrylate with filler, or polymer with proper filler. Encapsulant 160 is non-conductive, provides structural support, and environmentally protects the semiconductor device from external elements and contaminants. In particular, encapsulant 160 is deposited over semiconductor die 104, semiconductor package 140, partition fence 130, and substrate 120 after bonding the partition fence, semiconductor die, and semiconductor package to the substrate. Encapsulant 160 is deposited with a thickness to cover surface 162 of partition fence 130.

Semiconductor die 104 or semiconductor package 140 may contain IPDs that are susceptible to or generate EMI, RFI, harmonic distortion, and inter-device interference. For example, the IPDs contained within semiconductor die 104 or semiconductor package 140 provide the electrical characteristics needed for high-frequency applications, such as resonators, high-pass filters, low-pass filters, band-pass filters, symmetric Hi-Q resonant transformers, and tuning capacitors. In another embodiment, semiconductor die 104 contains digital circuits switching at a high frequency, which could interfere with the operation of IPDs in semiconductor package 140. In another embodiment, semiconductor die 104 has a first operating voltage and semiconductor package 140 has a second operating voltage, where the second operating voltage is significantly greater than the first operating voltage, or visa-versa.

Partition fence 130 reduces cross-talk or interference, e.g., EMI or RFI, between semiconductor die 104 and semiconductor package 140. Partition fence 130 also provides physical and electrical isolation between semiconductor die 104 and semiconductor package 140.

Figure 2I:
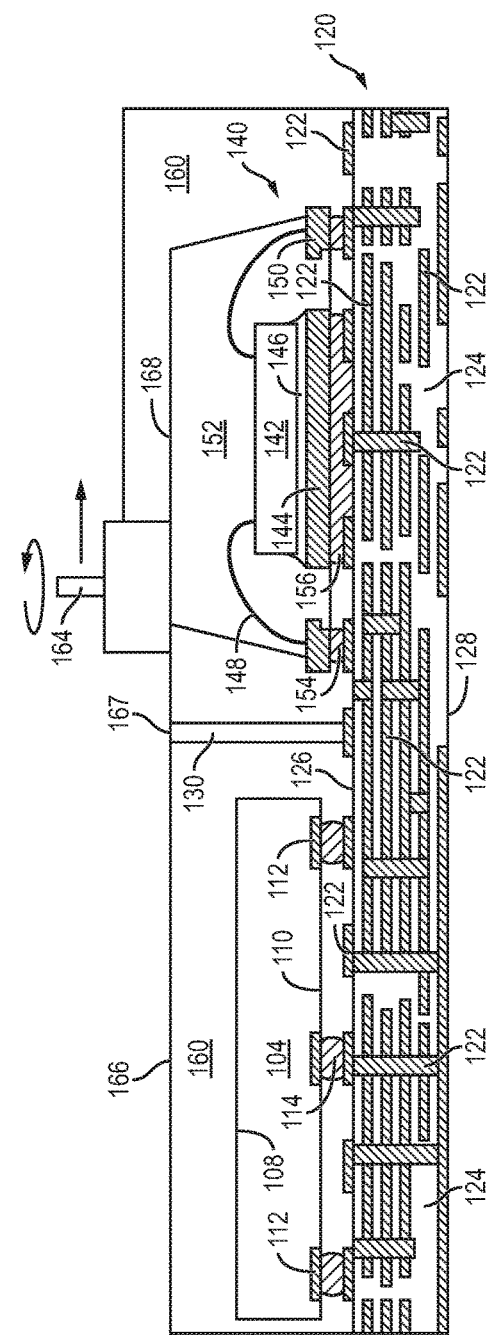

In FIG. 2i, a portion of encapsulant 160 and a portion of partition fence 130 are removed by grinder 164 to expose surface 167 of partition fence 130 and surface 168 of encapsulant 152. Grinder 164 further planarizes surface 166 of encapsulant 160, surface 167 of partition fence 130, and surface 168 of encapsulant 152. Alternatively, a portion of encapsulant 160 a portion of partition fence 130 are removed by an etching process or laser direct ablation (LDA) to planarize surfaces 166-168 and expose surface 167 of partition fence 130 and surface 168 of encapsulant 152.

Figure 2J:
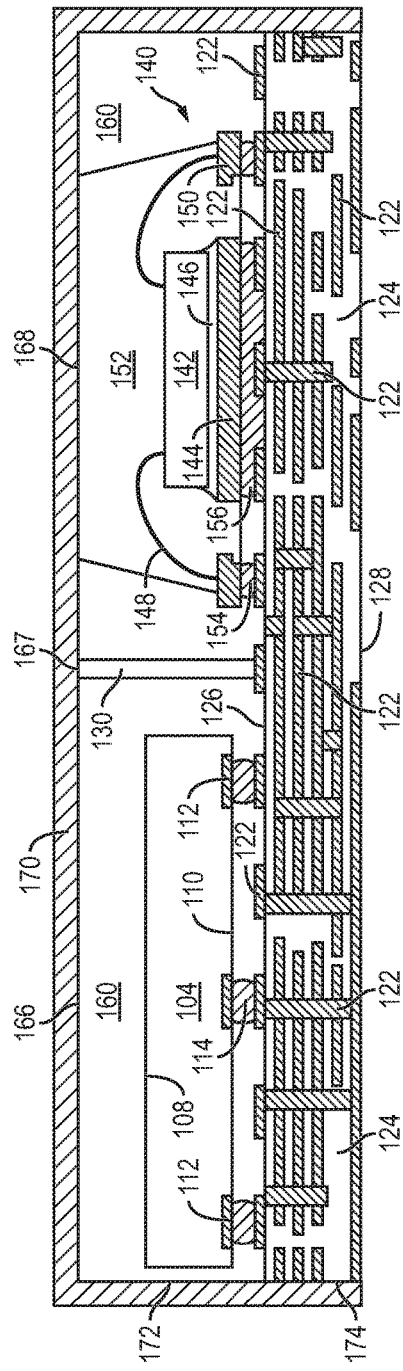

In FIG. 2j, a shielding layer 170 is formed over surface 166 of encapsulant 160, surface 167 of partition fence 130, and surface 168 of encapsulant 152. Shielding layer 170 can be one or more layers of Al, Cu, Sn, Ni, Au, Ag, or other suitable conductive material. Alternatively, shielding layer 160 can be carbonyl iron, stainless steel, nickel silver, low-carbon steel, silicon-iron steel, foil, conductive resin, carbon-black, aluminum flake, and other metals and composites capable of reducing the effects of EMI, RFI, and other inter-device interference. In particular, shielding layer 170 directly contacts surface 167 of partition fence 130 for an external ground. Shielding layer 170 and partition fence 130 form sealed compartments for physical and electrical isolation of semiconductor die 104 and semiconductor package 140. In addition, shielding layer 170 covers side surfaces 172 of encapsulant 160 and side surfaces 174 of substrate 120.

Figure 3:
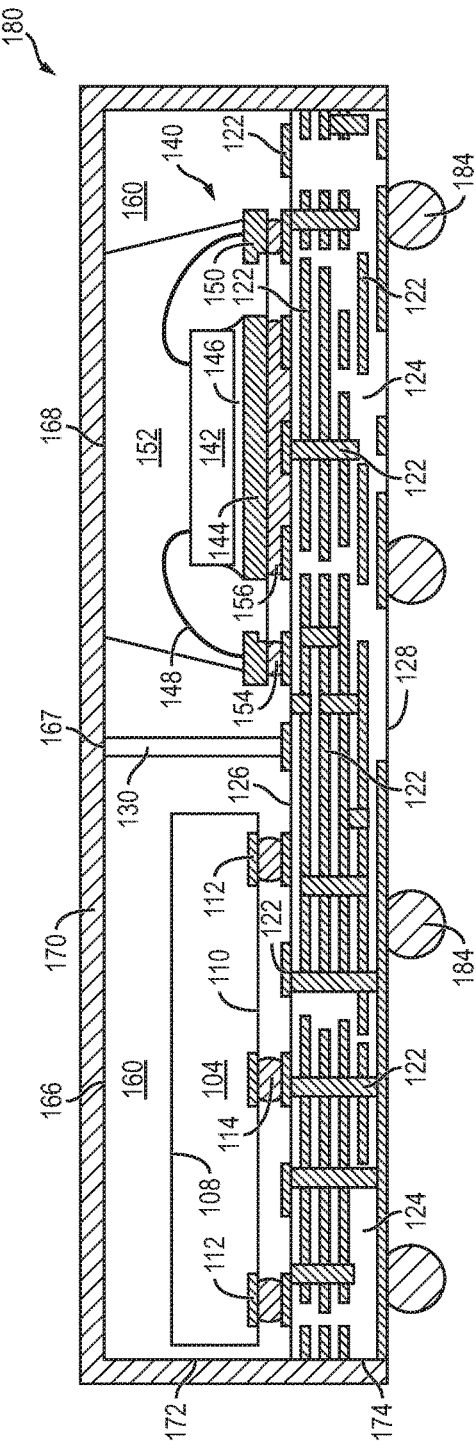
FIG. 3 illustrates an SIP module with a shielding layer in direct contact with the partition fence disposed around semiconductor components.

FIG. 3 illustrates SIP module 180 containing semiconductor die 104 and semiconductor package 140 bonded to substrate 120. An electrically conductive bump material is deposited over conductive layer 122 on surface 128 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 122 using a suitable attachment or bonding process. In one embodiment, the bump material is reflowed by heating the material above its melting point to form balls or bumps 184. In one embodiment, bump 184 is formed over an under bump metallization (UBM) having a wetting layer, barrier layer, and adhesive layer. Bump 184 can also be compression bonded or thermocompression bonded to conductive layer 122. Bump 184 represents one type of interconnect structure that can be formed over conductive layer 122. The interconnect structure can also use bond wires, conductive paste, stud bump, micro bump, or other electrical interconnect.

The combination of partition fence 130 and shielding layer 170 compartmentalize semiconductor die 104 and semiconductor package 140 for physical and electrical isolation to reduce the influence of EMI, RFI, and other inter-device interference. The grinding operation on encapsulant 160 reduces a thickness of SIP module 180 and provides planar surfaces 166-168 to form shielding layer 170. After the grinding operation, shielding layer 170 directly contacts surface 167 of partition fence 130 to simplify the electrical connection between the shielding layer and partition fence. The direct electrical connection between shielding layer 170 and partition fence 130 enhances the isolation properties of SIP module 180 and reduces manufacturing cost.

Figure 4:
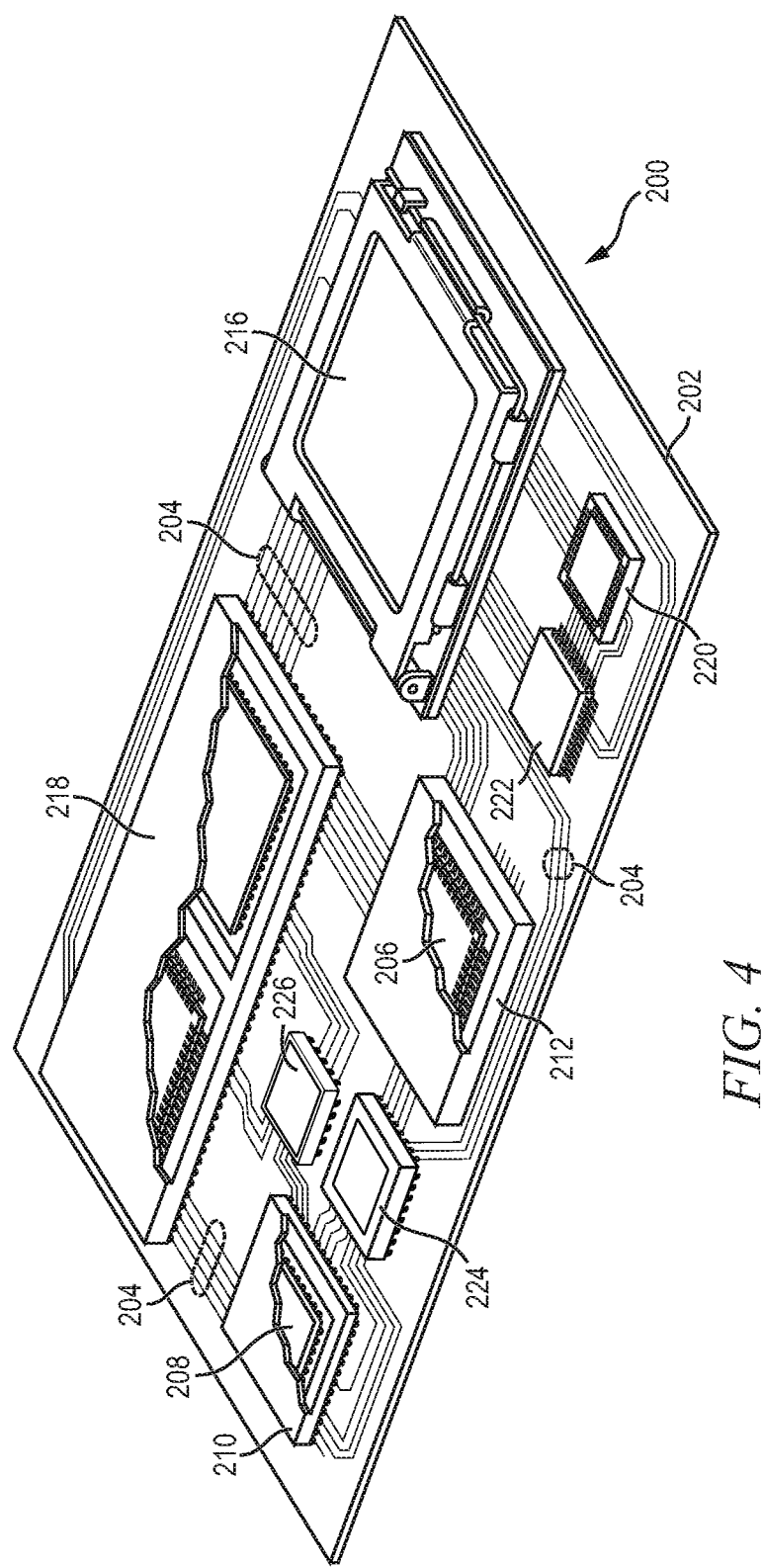
FIG. 4 illustrates a printed circuit board (PCB) with different types of packages mounted to a surface of the PCB.

FIG. 4 illustrates electronic device 200 having a chip carrier substrate or PCB 202 with a plurality of semiconductor packages mounted on a surface of PCB 202, including SIP module 180. Electronic device 200 can have one type of semiconductor package, or multiple types of semiconductor packages, depending on the application.

Electronic device 200 can be a stand-alone system that uses the semiconductor packages to perform one or more electrical functions. Alternatively, electronic device 200 can be a subcomponent of a larger system. For example, electronic device 200 can be part of a tablet, cellular phone, digital camera, communication system, or other electronic device. Alternatively, electronic device 200 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 4, PCB 202 provides a general substrate for structural support and electrical interconnect of the semiconductor packages mounted on the PCB. Conductive signal traces 204 are formed over a surface or within layers of PCB 202 using evaporation, electrolytic plating, electroless plating, screen printing, or other suitable metal deposition process. Signal traces 204 provide for electrical communication between each of the semiconductor packages, mounted components, and other external system components. Traces 204 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 206 and flipchip 208, are shown on PCB 202. Additionally, several types of second level packaging, including ball grid array (BGA) 210, bump chip carrier (BCC) 212, land grid array (LGA)

216, multi-chip module (MCM) 218, quad flat non-leaded package (QFN) 220, quad flat package 222, embedded wafer level ball grid array (eWLB) 224, and wafer level chip scale package (WLCSP) 226 are shown mounted on PCB 202. In one embodiment, eWLB 224 is a fan-out wafer level package (Fo-WLP) and WLCSP 226 is a fan-in wafer level package (Fi-WLP). Depending upon the system requirements, any combination of semiconductor packages, configured with any combination of first and second level packaging styles, as well as other electronic components, can be connected to PCB 202. In some embodiments, electronic device 200 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   disposing a partition fence between a first attach area and a second attach area on the substrate;
   disposing a first electrical component over the first attach area;
   disposing a second electrical component over the second attach area with a first encapsulant disposed over the second electrical component;
   depositing a second encapsulant over the substrate and around the first electrical component, second electrical component, and partition fence;
   planarizing the second encapsulant to expose a top surface of the partition fence and a surface of the first encapsulant; and
   forming a shielding layer over the second encapsulant and in contact with the first encapsulant and the top surface of the partition fence.

2. The method of claim 1, wherein the partition fence extends along a length of the first electrical component and second electrical component.

3. The method of claim 1, wherein the partition fence extends above the first electrical component and second electrical component.

4. The method of claim 1, further including forming a conductive layer over the substrate, wherein the partition fence is electrically connected to the conductive layer.

5. The method of claim 1, wherein the first electrical component or second electrical component includes an integrated passive device.

6. A method of making a semiconductor device, comprising:
   providing a substrate;
   disposing a first electrical component over the substrate;
   disposing a second electrical component over the substrate;
   disposing a partition fence between the first electrical component and second electrical component;
   depositing an encapsulant over the substrate and around the first electrical component, second electrical component, and partition fence;
   planarizing the encapsulant to a level even with a top surface of the partition fence; and
   forming a shielding layer over the encapsulant with the shielding layer in direct contact with all portions of the surface of the partition fence.

7. The method of claim 6, wherein the partition fence extends along a length of the first electrical component and second electrical component.

8. The method of claim 6, wherein the partition fence extends above the first electrical component and second electrical component.

9. The method of claim 6, further including forming a conductive layer over the substrate, wherein the partition fence is electrically connected to the conductive layer.

10. The method of claim 6, wherein the first electrical component or second electrical component includes an integrated passive device.

11. A semiconductor device, comprising:
    a substrate;
    a partition fence disposed between a first attach area and a second attach area on the substrate;
    a first electrical component disposed over the first attach area;
    a second electrical component disposed over the second attach area;
    an encapsulant deposited over the substrate and around first electrical component, second electrical component, and partition fence and planarized to a level even with a top surface of the partition fence; and
    a shielding layer formed over the encapsulant and in direct contact with the top surface of the partition fence.

12. The semiconductor device of claim 11, wherein the partition fence extends along a length of the first electrical component and second electrical component.

13. The semiconductor device of claim 11, wherein the partition fence extends above the first electrical component and second electrical component.

14. The semiconductor device of claim 11, further including a conductive layer formed over the substrate, wherein the partition fence is electrically connected to the conductive layer.

15. The semiconductor device of claim 11, wherein the first electrical component or second electrical component includes an integrated passive device.

16. The semiconductor device of claim 11, wherein the first electrical component or second electrical component includes a semiconductor die.

17. A semiconductor device, comprising:
    a substrate;
    a first electrical component disposed over the substrate;
    a second electrical component disposed over the substrate;
    a partition fence disposed between the first electrical component and second electrical component;
    an encapsulant deposited around the substrate, first electrical component, second electrical component, and partition fence and planarized to a level even with a top surface of the partition fence; and
    a shielding layer formed over the encapsulant with the shielding layer in direct contact with the top surface of the partition fence.

18. The semiconductor device of claim 17, wherein the partition fence extends along a length of the first electrical component and second electrical component.

19. The semiconductor device of claim 17, wherein the partition fence extends above the first electrical component and second electrical component.

20. The semiconductor device of claim 17, further including a conductive layer formed over the substrate, wherein the partition fence is electrically connected to the conductive layer.

21. The semiconductor device of claim 17, wherein the first electrical component or second electrical component includes an integrated passive device.

22. The semiconductor device of claim 17, wherein the first electrical component or second electrical component includes a semiconductor die.

\* \* \* \* \*